US012650444B2

(12) United States Patent
Lee et al.

(10) Patent No.: US 12,650,444 B2
(45) Date of Patent: Jun. 9, 2026

(54) PROBE CARD DEVICE

(71) Applicant: Silicon Future Manufacturing Company Ltd., Hsinchu City (TW)

(72) Inventors: Tien-Chia Lee, Hsinchu City (TW); Heng-Rui Chang, Hsinchu City (TW); You-Chen Lin, Hsinchu City (TW); Ming-Chang Liao, Hsinchu City (TW); Wen-Tsung Sung, Hsinchu City (TW)

(73) Assignee: SILICON FUTURE MANUFACTURING COMPANY LTD., Hsinchu City (TW)

( * ) Notice: Subject to any disclaimer, the term of this patent is extended or adjusted under 35 U.S.C. 154(b) by 172 days.

(21) Appl. No.: 18/650,536

(22) Filed: Apr. 30, 2024

(65) Prior Publication Data

US 2024/0369599 A1 Nov. 7, 2024

(30) Foreign Application Priority Data

May 1, 2023 (TW) ................................. 112116187

(51) Int. Cl.
G01R 1/07 (2006.01)
G01R 1/073 (2006.01)
G01R 31/28 (2006.01)

(52) U.S. Cl.
CPC ......... G01R 1/071 (2013.01); G01R 1/07314 (2013.01); G01R 1/07364 (2013.01); G01R 31/2886 (2013.01)

(58) Field of Classification Search
CPC ............... G01R 1/071; G01R 1/07314; G01R 1/07364; G01R 31/2886
See application file for complete search history.

(56) References Cited

U.S. PATENT DOCUMENTS

| | | | | |
|---|---|---|---|---|
| 4,126,380 A | * | 11/1978 | Borm | G01D 5/32 |
| | | | | 359/227 |
| 4,820,975 A | * | 4/1989 | Diggle | G01R 1/07335 |
| | | | | 324/763.01 |
| 5,091,692 A | * | 2/1992 | Ohno | G01R 1/07314 |
| | | | | 348/130 |

(Continued)

FOREIGN PATENT DOCUMENTS

| | | | |
|---|---|---|---|
| JP | H0662380 U | * | 9/1994 |
| JP | 2007-95786 A | | 4/2007 |

(Continued)

*Primary Examiner* — Daniel R Miller

(74) *Attorney, Agent, or Firm* — Birch, Stewart, Kolasch & Birch, LLP

(57) ABSTRACT

A probe card device comprises a testing circuit board, at least one probe and an image capture module. The testing circuit board has a first surface and a second surface in opposite. The at least one probe is disposed on the first surface of the testing circuit board and electrically connected to the testing circuit board. The at least one probe has a probe head and the probe head has a first height to the first surface. The image capture module is disposed on the first surface of the testing circuit board, and is located adjacent to the probe. The image capture module has a head portion and the head portion has a second height to the first surface. Wherein, the second height is smaller than the first height, and the image capture module is aligned to the probe head to capture a visible light image from the probe head.

12 Claims, 3 Drawing Sheets

(56) References Cited

U.S. PATENT DOCUMENTS

| | | | | |
|---|---|---|---|---|
| 5,150,041 A * | 9/1992 | Eastin | ................ | G01R 1/07314 |
| | | | | 324/763.02 |
| 5,974,662 A * | 11/1999 | Eldridge | .............. | B23K 20/004 |
| | | | | 257/E21.507 |
| 6,424,164 B1 * | 7/2002 | Kister | ................ | G01R 1/07357 |
| | | | | 324/754.13 |
| 6,545,458 B2 | 4/2003 | Yamazaki | | |
| 7,868,632 B2 | 1/2011 | Cooper et al. | | |
| 2003/0085723 A1 * | 5/2003 | Martens | ............ | G01R 1/07342 |
| | | | | 324/754.07 |
| 2004/0124862 A1 * | 7/2004 | Sugawara | .......... | G01R 1/07357 |
| | | | | 324/750.25 |
| 2004/0130312 A1 * | 7/2004 | Cooper | .............. | G01R 31/2887 |
| | | | | 324/140 R |
| 2009/0021276 A1 * | 1/2009 | Boss | .................. | G01R 1/06788 |
| | | | | 324/755.01 |
| 2023/0384365 A1 * | 11/2023 | Kim | ....................... | G01K 3/005 |

FOREIGN PATENT DOCUMENTS

| | | | |
|---|---|---|---|
| JP | 2014-106216 A | 6/2014 | |
| TW | I505384 B | 10/2015 | |

* cited by examiner

PROBE CARD DEVICE

CROSS-REFERENCE TO RELATED APPLICATION

This non-provisional application claims the benefit under 35 U.S.C. § 119 (a) to Patent Application No. 112116187, filed in Taiwan on May 1, 2023, which is hereby expressly incorporated by reference into the present application.

TECHNICAL FIELD

The present application relates to a probe card device. Specifically, the present application relates to a probe card device with an image capture module.

BACKGROUND

In recent years, with booming development of the electronics industry, semiconductor chips and circuit boards are widely used in various electronic products. In the manufacturing process of the semiconductor chips and the circuit boards, in order to confirm whether the semi-finished products after each process have defects, various electrical tests may be performed after each of the process to identify and mark defective product units.

The detection pitch of the detection pads within product unit is shrinking due to the increased density of the circuit on the semiconductor chips and the decreased size of the product unit of the semiconductor chips and circuit boards. In post-process electrical testing equipment, probe card is currently commonly used for high-density probe testing of highly dense semiconductor chips and circuit boards to satisfy the gradually shrunk detection spacing. The probe cards which are currently commonly used include micro electro mechanical system (MEMs) probe card, horizontal probe card and vertical probe card. The vertical probe card is commonly used to test high-density product due to its small contact area. The vertical probe card only produces point scratches after testing and the caused damage to the product is relatively minimum.

Since the vertical probe card includes a probe head in the center, it is difficult to form a hole in the center for alignment. Although the vertical probe card can be aligned on the edge of the board, it is not easy to confirm whether the central probe head is aligned with the contact pad of the object under test. It is also difficult to confirm contact situation between the probe head and the contact pad, because it is easy to cause no contact or poor contact. Especially, when the size of the probe becomes smaller and smaller, the tolerance for dimensional errors becomes smaller and smaller, it becomes more difficult to confirm the status of contact. Thus, how to check and confirm the status of contact between the probe head and the contact pad is an important issue in this field.

SUMMARY

An object of the invention is to provide a probe card device. When the probe head is in contact with the contact pad, an image capture module is used to align the probe head, capture the visible light image of the probe head, and confirm whether the contact between the probe head and the contact pad is good or not. The image capture module is used to capture visible light image of a probe head, determine whether the movement position of the probe card is accurate or not, confirm whether the relative alignment parameters need to be adjusted, and confirm the adjustment direction, etc.

An embodiment of the invention provides a probe card device, includes a testing circuit board, at least one probe and an image capture module. The testing circuit board includes a first surface and a second surface opposite to the first surface. The at least one probe is disposed on the first surface of the testing circuit board and electrically connected to the testing circuit board. The at least one probe includes a probe head, and the probe head includes a first height from the first surface. The image capture module is disposed on the first surface, and the image capture module is disposed adjacent to the probe. The image capture module includes a head portion, and the head portion includes a second height from the first surface. The second height is smaller than the first height. The image capture module is aligned to the probe head to capture a visible light image of the probe head.

Compared to the prior art, in the probe card device of the invention, the image capture module is disposed on the probe card and adjacent to the probe of the probe head. The height of the image capture module is smaller than the height of the probe, and the image capture module capture a visible light image of the probe head from side of the probe. The image capture module can move together with the probe and the probe card, and can capture visible light images of the probe head from the side of the probe at any time to confirm whether the contact situation between the probe head and the contact pad is good or not.

DETAILED DESCRIPTION

Figure 1:
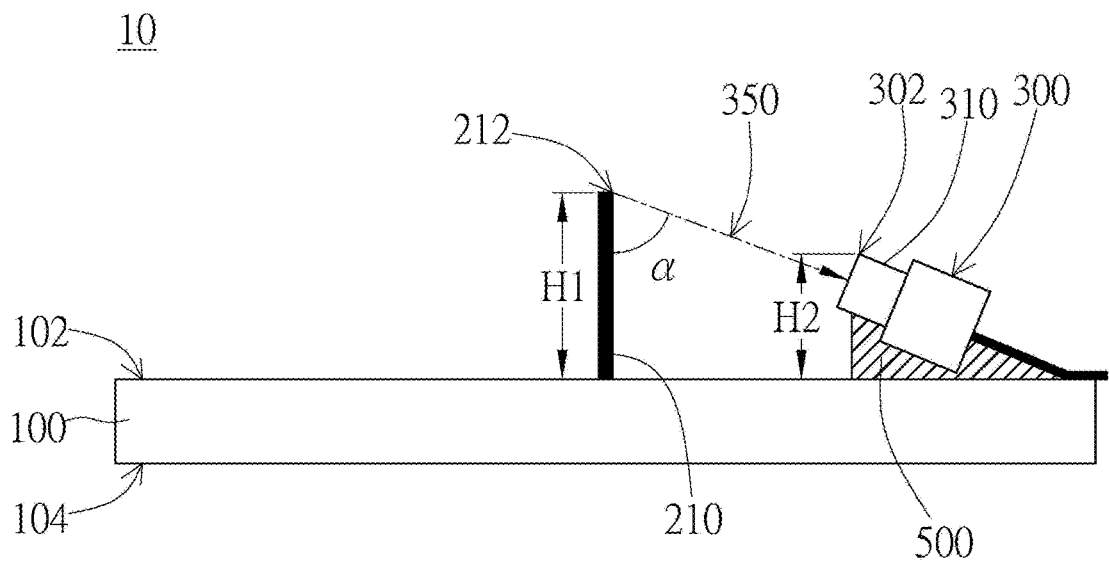
FIG. 1 is a schematic structural diagram of a probe card device that a probe pointing upward according to an embodiment of the invention.

In various embodiments of the invention, the terminology used herein is for the purpose of describing particular embodiments only and is not limiting. As shown in the specification, unless the content clearly dictates, the singular forms "a", "an" and "the" are intended to include the plural forms including "at least one". As shown in the specification, the term "a" includes any and all combinations of one or more of the associated listed items.

In various embodiments of the invention, "top" or "bottom" are only used to illustrate the orientation presented in the drawings, and do not limit its actual position. In practice, when test is performed, the probe of the probe card will face downwards, and face to the object under test.

Figure 2:
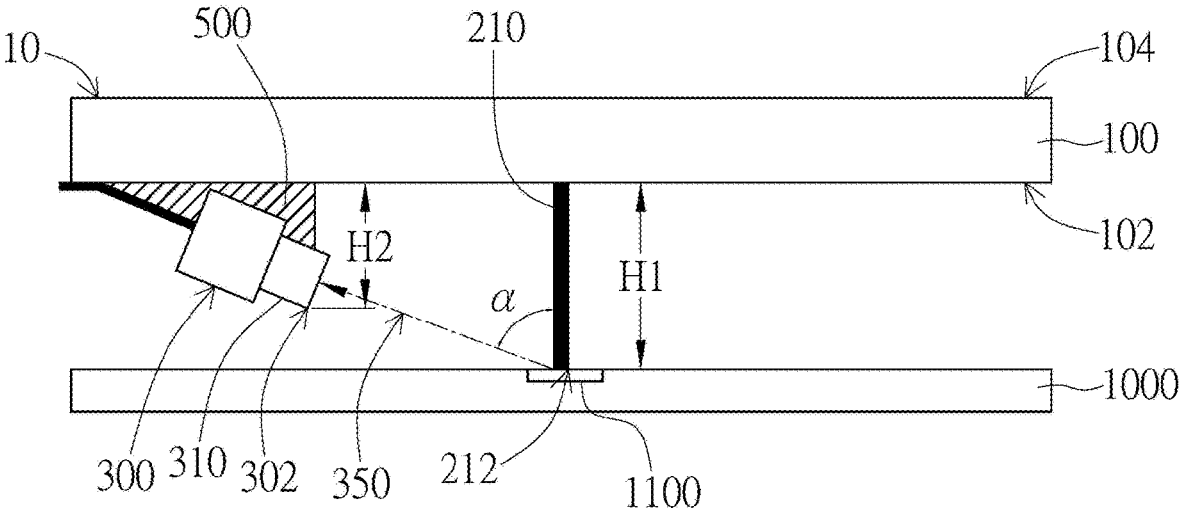
FIG. 2 is a schematic structural diagram of a probe card device testing downward according to an embodiment of the invention.

FIG. 1 is a schematic structural diagram of a probe card device that a probe pointing upward according to an embodiment of the invention. FIG. 2 is a schematic structural diagram of a probe card device testing downward according to an embodiment of the invention. Please refer to FIG. 1 and FIG. 2, the probe card device 10 at least includes a testing circuit board 100, at least one probe 210 and an image capture module 300. The probe 210 includes a probe head 212, the image capture module 300 is aligned to the probe head 212 from the side of the probe 210 to capture a visible light image of the probe head 212, so as to confirm whether the contact condition of the probe head 212 is good or not at any time.

Please refer to FIG. 1 and FIG. 2, the testing circuit board 100 is, for example, a print circuit board (PCB), and the circuit design can be adjusted with reference to the type of the object under test 1000. The testing circuit board 100 can be designed, for example, in a circle, a square, a rectangle or other special shapes, which can be determined by requirements, however, the invention is not limited thereto. The testing circuit board 100 includes a testing circuit, and the required test signals are input to test the object under test 1000. The testing circuit board 100 includes a first surface 102 and a second surface 104 opposite to the first surface 102, the first surface 102 can use to dispose probe 210 and the second surface 104 can use to input testing signals, which are not limited herein.

Please refer to FIG. 1 and FIG. 2, at least one probe 210 is disposed on the first surface 102 of the testing circuit board 100, and the at least one probe 210 is electrically connected to the testing circuit board 100. The at least one probe 100 can be one or a plurality of the probes 210, the number of the probes 210 is not limited herein and can be disposed by requirement. The at least one probe 210 includes a probe head 212 which is used to contact the object under test 1000. The probe head 212 includes a first height H1 from the first surface 102. The probe 210 can be disposed on the first surface 102 of the testing circuit board 100 by a fixing member (not shown). For example, the probe 210 can be disposed in a center area of the first surface 102, which is not limited herein. The probe 210 can be a general probe or a microprobe, and its length and diameter can be on the millimeter (mm) level, on the micron (μm) level, or even on the nanometer (nm) level. The main body material of the probe 210 is usually a metal material with low resistivity, such as copper, silver, gold, their alloys or combinations thereof, but is not limited thereto. The surface of the probe 210 can selectively form an inert conductive layer to prevent the probe 210 from oxidizing and increase its service life. The material of inert conductive layer is, for example, gold, platinum, silver, iridium, osmium, palladium, rhodium, ruthenium, their alloys or combinations thereof, but is not limited thereto. The surface of the probe 210 can selectively form a wear-resistant conductive layer to increase the service life of the probe head 212. The material of the wear-resistant conductive layer is for example, tungsten, palladium, platinum, chromium, rhodium, rhenium, etc., their alloys or combinations thereof, but is not limited thereto.

Please refer to FIG. 1 and FIG. 2, the image capture module 300 is disposed on the first surface 102 of the testing circuit board 100, and the image capture module 300 is disposed adjacent to the probe 210, so that the image capturing structure 300 can capture the visible light image of the probe head 212 from the side of the probe 210 at any time. As common people know, visible light with various colors can be seen by human's eye, and its wavelength range is approximately between 380 nm to 830 nm, such as blue light (B), green light (G), red light (R), and various lights mixed by three basic primary colors. When the length of the probe 210 is millimeter (mm) level, for example, between 10 mm to 1 mm, the image capturing structure 300 can use a micro lens 310. The lens diameter of the micro lens 310 can be smaller than 10 mm, for example, between 10 mm to 1 mm. The micro lens 310 can be effectively fixed on the first surface 102 of the testing circuit board 100 by selectively using a positioning module 500. For example, the positioning module 500 can be an adhesive or a fixing member to achieve the effect of fixing the image capturing structure 300. The image capturing structure 300 (such as the micro lens 310) includes a head portion 302. The head portion 302 is the part of the image capturing structure 300 that is farthest from the first surface 102, such as the part closest to the probe 210 as shown in FIG. 1.

Please refer to FIG. 1 and FIG. 2, the probe card device 10 is faced downward to the object under test 1000 when in use. The head portion 302 of the image capturing structure 300 includes a second height H2 from the first surface 102, the second height H2 is smaller than the first height H1. It can ensure that when the probe head 212 contacts the contact pad 1100 of the object under test 1000, the image capture module 300 will not contact with the object under test 1000. The image capturing structure 300 is aligned to the probe head 212 to capture a visible light image of the probe head 212. The image capture module 300 is disposed on a side of the probe 210, thereby a light line of an image capture path 350 form an included angle with the probe 210 at the probe head 212, which can be called an image capture angle α. The image capture angle α, for example, is between 1 to 89 degrees, and is preferably between 40 to 85 degrees. The visible light image of the probe head 212 can be effectively captured from the side of the probe 210, and the contact situation of the probe head 212 can be confirmed at any time. The image capture module 300 captures the image of the probe head 212 from the side surface of the probe 210 with larger image capture angle, so a clearer image of the probe head 212 can be obtained, which will not be covered by the probe 210, and the accuracy of the probe head 212 won't be affected. When the probe head 212 is moving to close to the contact pad 1100 of the object under test 1000, the distance between the probe head 212 and the contact pad 1100 can be clearly monitored at any time, and the contact situation between the probe head 212 and the contact pad 1100 can be monitored. Thus, when the probe card device 10 moves to the predetermined position, the probe head 212 is reserved to contact to the contact pad 1100. The image capturing structure 300 can clearly capture the contact image and compare with the prestored image which makes good contact, so as to determine whether the contact between the probe head 212 and the contact pad 1100 is good or not. If the probe head 212 doesn't contact with the contact pad 1100 or the offset of the contact situation is occurred, the image capturing structure 300 can clearly capture the image with poor contact and compare the error with the prestored image with good contact. If the error exceeds the preset range, a warning can be issued to allow the user to confirm whether there is an error in the measurement.

Figure 3:
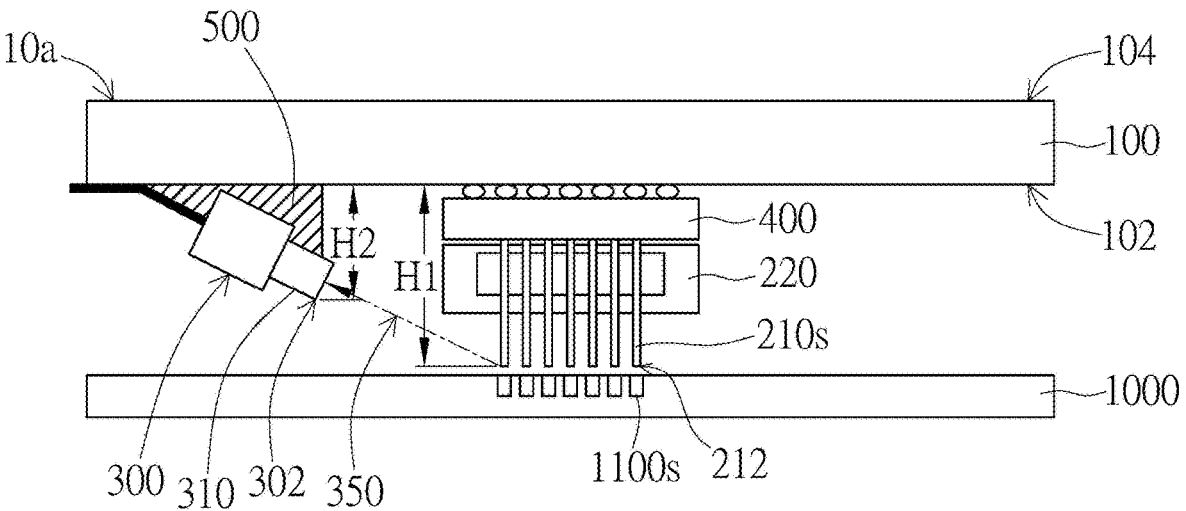
FIG. 3 is a schematic structural diagram of a probe card device according to another embodiment of the invention.

FIG. 3 is a schematic structural diagram of a probe card device according to another embodiment of the invention. Please refer to FIG. 3. In the embodiment which is similar to the aforementioned embodiments of FIG. 1 and FIG. 2, the same symbols can be used for reference, but it is not limited. In the embodiment, the probe card device 10a at least includes a testing circuit board 100, a plurality of probes 210s and an image capturing structure 300. In addition, the probe card device 10a further includes a space transformer 400 and a guide member 220. For example, the testing circuit board 100 can be a print circuit board which can be referred to the description of FIG. 1 and FIG. 2. The plurality of probe 210s are disposed corresponding to the first surface 102 of the testing circuit board 100, such as corresponding to the center area of the first surface 102, but it is not limited herein. The plurality of probe 210s have the same heights. Thus, each of the probe head 312 of the probe 210s has a substantially same first height H1 from the first surface 102 of the testing circuit board 100, so the plurality of probe 210s can contact the plurality of contact pads 1100s of the object under test 1000 and perform the conduct electrical test.

Please refer to FIG. 3. The 10a further includes the space transformer 400 disposed between the testing circuit board 100 and the plurality of probes 210s. When the probes 210s are densely arranged, the detection distance between the probes 210s is reduced. It is also called reducing the pitch spacing, such as from 5000 μm to 500 μm, or even 50 μm, or smaller spacing, it can be adjusted according to the design requirement of the measuring product. The testing circuit board needs the space transformer 400 to connect to the densely arranged probes 210s. For example, the space transformer 400 can be a space transforming substrate or a space transforming plate. The space transformer 400 is used to electrically connect to the testing circuit board 100 and the probes 210s, so the testing signal of the testing circuit board 100 can be transmitted to the densely arranged probes through the space transformer 400. One surface of the space transformer 400 can use the ball grid array (BGA) packaging technology or the pin grid array (PGA) packaging technology to electrically connect to the testing circuit board 100. The plurality of probes can be disposed on another surface of the space transformer 400, such as a contact pad of the side of the controlled collapse chip connection (C4). Each of the probe 210s is disposed on the corresponding contact pad. The aforementioned space transformer 400 is well-known to the people skilled in the art and can be designed with equivalent changes, so it will not describe herein.

Please refer to FIG. 3. The probe card device 10a further includes the guide member 210 to assist in fixing the probe 210s, and the plurality of probes 210s are disposed in the guide member 210. For example, the 220 includes an upper guide plate and a lower guide plate (not shown), but it is not limited. The upper guide plate and the lower guide plate respectively include a plurality of holes to fix the position of the probes 210s in the guide member 220. The guide member 200, for example, can be fixed to the space transformer 400 by screws or other suitable fixing methods (not shown), but it is not limited. The probe head 212 of the probe 210s is passed through the hole inside the guide member 220 to be fixed onto its predetermined measuring position. At another end of the probe head 212, a probe tail of the probe head 210s is electrically connected to the space transformer 400 and extended to be electrically connected to the testing circuit board 100. Thus, the testing signal is inputted from the testing circuit board 100 and transmitted to the probe head 212 through the probe tail. The probe head 212 is in contact with the object under test 1000 and performs the conduct electrical test, and sends back the testing result. The aforementioned guide member 220 is only used for example, the people skilled in the art can make equivalent replacements with other structural designs, and the structural design of the guide member 220 is not limited. The aforementioned guide member 220 is well-known by the people skilled in the art, so it will not describe herein.

Please refer to FIG. 3. The image capture module 300 is disposed on the first surface 102 of the testing circuit board 100 and the image capture module 300 is disposed near the probe 210s, so the image capture module 300 can capture the visible light image of the probe head 212 from the side surface of the probe 210s at any time. The probe head 212 has a first height H1 from the first surface 102, and the head 302 of the image capture module 300 has a second height H2 from the first surface 102, where the second height H2 is smaller than the first height H1. Thereby, when the probe 212 is in contact with the object under test 1000, the image capture module 300 won't contact with the object under test 1000. For example, when the first height H1 is on the millimeter (mm) level, the image capture module 300 can use a micro lens 310 which the lens diameter is smaller than 10 mm, such as between 10 mm and 1 mm, and is smaller than the first height H1. Therefore, when the probe head 212 is in contact with the object under test 1000, the image capture module 300 won't contact with the object under test 1000. The image capture module 300 can selectively use a positioning module 500 to assist in fixing the image capture module 300 onto the first surface 102 of the testing circuit board 100. The positioning module 300 can be an adhesive or a fixing member to achieve the effect of fixing the image capture module 300, so the image capture module 300 can be aligned to the probe head 212.

Please refer to FIG. 3. The image capture module 300 is aligned to the probe head 212 from the side surface and capture the visible light image of the probe head 212. The image capture module 300 is disposed on the side surface of the 210s. Thereby an angle is formed on the probe head 212 by the straight line of the light of the image capture path 350 and the nearest probe 210s, and the angle is also called an image capture angle α. The image capture angle α is, for example, between 1° and 90°, and is preferably between 40° and 85°, so it can effectively capture the visible light image of the probe head 212 from the side surface of the probe 210s and check the contact situation of the probe head 212 at any time. Although the image capture module 300 is only aligned to the nearest probe 210s, but it can still capture the nearby image of the probe 210s and provide enough image information to the connected equipment and user to make judgement.

Figure 4:
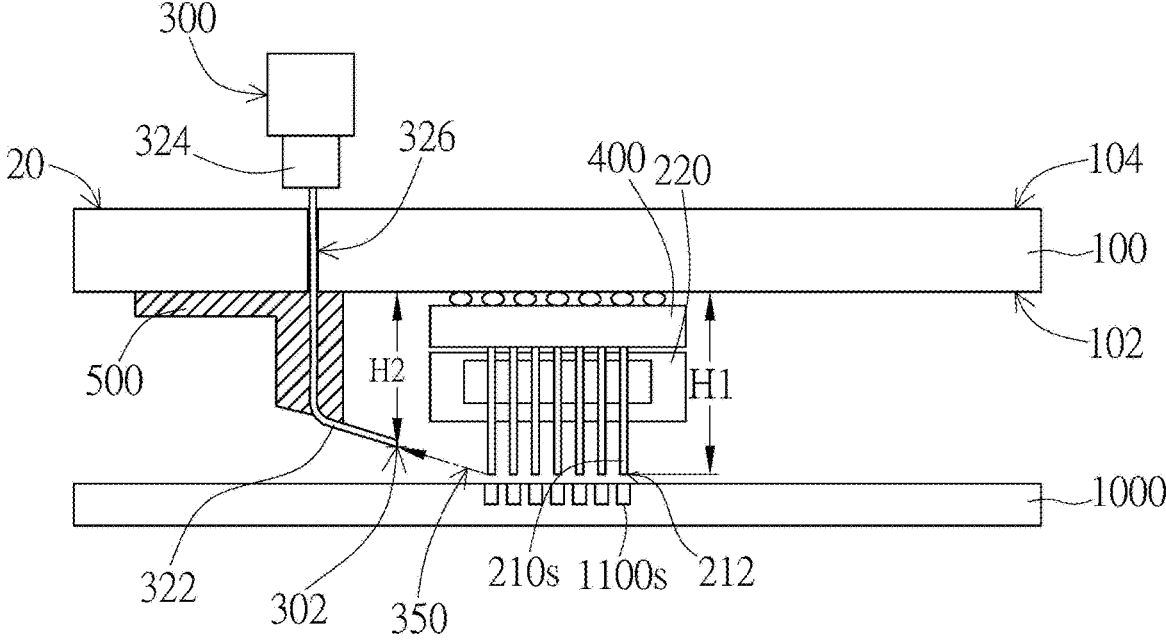
FIG. 4 is a schematic structural diagram of a probe card device according to another embodiment of the invention.

FIG. 4 is a schematic structural diagram of a probe card device according to another embodiment of the invention. Please refer to FIG. 4. In the embodiment which is similar to the aforementioned embodiments of FIG. 1 to FIG. 3, the same symbols can be used for reference, but it is not limited. In the embodiment, the probe card device 20 at least includes a testing circuit board 100, a plurality of probe 210s and an image capture module 300. In addition, the probe card device 20 can further include a space transformer 400 and a guide member 220. The testing circuit board 100 is, for example, a print circuit board. The space transformer 400 is, for example, a space transforming carrier. The testing circuit board 100, the guide member 220 and the space transformer 400 can refer to the relative description of the embodiment of the FIG. 1 to FIG. 3, but they are not limited. The plurality of probes 210s are disposed on the first surface 102 of the testing circuit board 100, such as the center area of the first surface 102, but it is not limited. The plurality of probes 210s have substantially the same height, so the probe head 312 of each of the probe 210s has substantially the same first height H1 from the first surface 102 of the testing circuit board 100. The plurality of probes 210s can simultaneously contact to the plurality of contact pads 1100s of the object under test 1000 and perform the conduct electrical test.

Please refer to FIG. 4. The image capture module 300 is disposed on the first surface 102 of the testing circuit board 100 and the image capture module 300 is disposed near the probe 210s, so the image capture module 300 can capture a visible light image of the probe head 212 from the side surface of the probe 210s at any time. The image capture module 300 is disposed on the first surface 102 of the testing circuit board 100 and near the probe 210s, so the image capture module 300 can capture a visible light image of the probe head 212 from the side surface of the probe 210s at any time. The probe head 212 has a first height H1 from the first surface 102, the head 302 of the image capture module 300 has a second height H2 from the first surface 102, where the second height H2 is smaller than the first height H1, so it can be determined that when the probe head 212 is in contact to the contact pad 1100s of the object under test 1000, the image capture module 300 won't contact with the object under test 1000. When the first height H1 is in the range of millimeters (mm) to microns (μm) such as between 10 mm and 10 μm, the image capture module 300 can use an optical fiber 322 and a lens 324 for example. One end of the optical fiber 322 is aligned to the probe head 212 of the probe 210s, the other end of the optical fiber 212 is connected to the lens 324, and the image of the probe head 212 is transmitted to the lens 324. The lens 324 can use an ordinary lens connected to the optical fiber which facilitates image transmission and setting, and the location and size are not limited. The diameter of the optical fiber 322 can be smaller than 10 μm, such as between 10 μm and 0.01 μm, and smaller than the first height H1. In this way, it can be determined that when the probe head 212 contacts with the object under test 1000, the optical fiber 322 won't contact with the object under test 1000. The optical fiber 322 can use a positioning module 500, such as an adhesive or a fixing member to effectively fix on the first surface 102 of the testing circuit board 100 in order to achieve the effect of fixing the optical fiber 322. A through hole 326 can be selectively disposed in the testing circuit board 100 near the probe 210s of the testing circuit board 100, so an image capturing end of the optical fiber 322 facilitates to pass through the through hole 326 from the second surface 104 and fixes on the first surface 102 of the testing circuit board 100, and is aligned to the probe head 212 of the probe 210s from the side surface.

Please refer to FIG. 4. The image capturing end of the optical fiber 322 is aligned to the probe head 212 and captures the visible light image of the probe head 212. The optical fiber 322 is disposed on the side surface of the probe 210s, thereby an angle is formed on the probe head 212 by the straight line of the light of the image capture path 350 and the nearest probe 210s, and the angle is also called an image capture angle α. The image capture angle α is, for example, between 1° and 90°, and is preferably between 40° and 85°, so it can effectively capture the visible light image of the probe head 212 from the side surface of the probe 210s and check the contact situation of the probe head 212 at any time. Although the image capture module 300 is only aligned to the nearest probe 210s, but it can still capture the nearby image of the probe 210s and provide enough image information to the equipment and user to make judgement.

Figure 5:
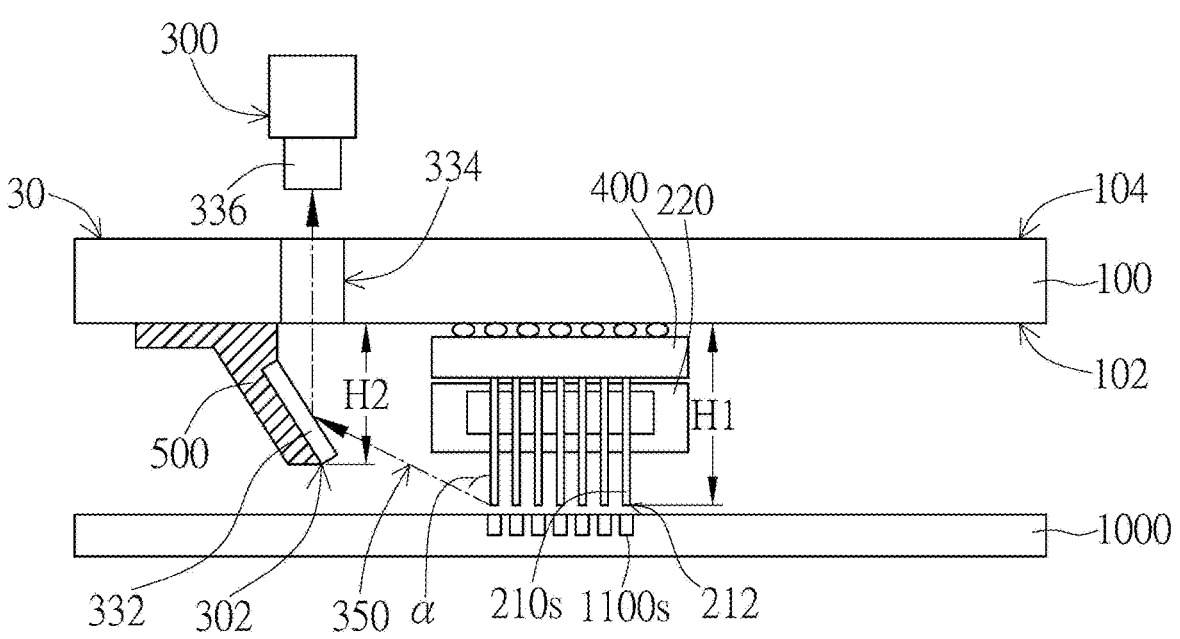
FIG. 5 is a schematic structural diagram of a probe card device according to another embodiment of the invention.

FIG. 5 is a schematic structural diagram of a probe card device according to another embodiment of the invention. Please refer to FIG. 5. In the embodiment which is similar to the aforementioned embodiments of FIG. 1 to FIG. 4, the same symbols can be used for reference, but it is not limited. In the embodiment, the probe card device 30 at least includes a testing circuit board 100, a plurality of probes 210s and an image capture module 300. In addition, the probe card device 30 further includes a space transformer 400 and a guide member 220. The testing circuit board 100 is, for example, a print circuit board. The space transformer 400 is, for example, a space transforming carrier. The testing circuit board 100, the guide member 220 and the space transformer 400 can refer to the relative description of the embodiment of the FIG. 1 to FIG. 3, but they are not limited. The plurality of probes 210s are disposed on the first surface 102 of the testing circuit board 100, such as the center area of the first surface 102, but it is not limited. The plurality of probes 210s have substantially the same height, so the probe head 312 of each of the probe 210s has substantially the same first height H1 from the first surface 102 of the testing circuit board 100. The plurality of probes 210s can simultaneously contact to the plurality of contact pads 1100s of the object under test 1000 and perform the conduct electrical test.

Please refer to FIG. 5. In the embodiment, the image capture module 300 can use, for example, a mirror 332, a through hole 334 and a lens 336. The mirror 332 is disposed on the first surface 102 of the testing circuit board 100 and is disposed near the probe 210s, so the mirror 332 can reflect the visible light image of the probe head 212 from the side surface of the probe 210s. The mirror 332, the through hole 334 and the lens 336 provide an image capture path 350. The visible light image of the probe head 212 is reflected by the mirror 332, and then passed through the through hole 334 to reach the lens 336, so the lens 336 can capture the visible light image of the probe head 212. The mirror 332 is disposed on the first surface 102 of the testing circuit board 100 and is disposed near the probe 210s, and the mirror 332 can reflect the visible light image of the probe head 212 to the lens 336 from the side surface of the probe 210s at any time. The probe head 212 has a first height H1 from the first surface 102, the head 302 of the mirror 332 has a second height H2, where the second height H2 is smaller than the first height H1, so it can be determined that when the probe head 212 is in contact to the contact pad 1100s of the object under test 1000, the mirror 332 won't contact with the object under test 1000. When the first height H1 is in the range of millimeters (mm) to microns (μm) such as between 10 mm and 10 μm, the height designed along a vertical direction of the mirror 332 is smaller than the first height H1 such as between 10 mm and 0.001 mm. The mirror 332 can selectively use a positioning module 500, the positioning module 500 is, for example, a fixing member, an adhesive or a micro mechanical structure. The positioning module 500 effectively fixes the mirror 332 on the first surface 102 of the testing circuit board 100 to achieve the effect of fixing the mirror 332. When the second height H2 of the mirror 332 is smaller than 1 mm, the mirror 332 and the positioning module 500 can selectively use the micro electro mechanical system (MEMS) technology to form an integrated structure of the mirror 332 and the positioning module 500 on the first surface 102 of the testing circuit board 100. The mirror 332 is not limited to a plane mirror, and it can also be designed to form a convex mirror or a concave mirror to the image capture results. The through hole 336 is disposed on the image capture path. The through hole 336 is disposed in the testing circuit board 100 and near the mirror 332, so the lens 36 can capture the visible light image of the probe head 212 reflected by the mirror 332. According to the visible light image of the probe head 212 captured by the lens 336, because the image is reflected by the mirror 332, the image will appear like a mirror image and show a left-right reverse image. The image can be selectively edited later by the image editing software to calibrate the left-right reverse image, so the monitor can display the correct image, and the image is provided to the equipment and user to make judgement.

Please refer to FIG. 5. The mirror 332, the image capture path of the through hole 334 and the lens 336 is aligned to the probe head 212 from the side surface to capture the visible light image of the probe head 212. The mirror 332 is disposed on a side of the probe 210, thereby a light line of an image capture path 350 form an included angle with the probe 210 at the probe head 212, which can be called an image capture angle α. The image capture angle α is, for example, between 1° and 90°, and is preferably between 40° and 85°, so it can effectively capture the visible light image of the probe head 212 from the side surface of the probe 210s and check the contact situation of the probe head 212 at any time. Although the mirror 332 is only aligned to the nearest probe 210s, but it can still capture the nearby image of the probe 210s and provide enough image information to the equipment and user to make judgement.

Figure 6:
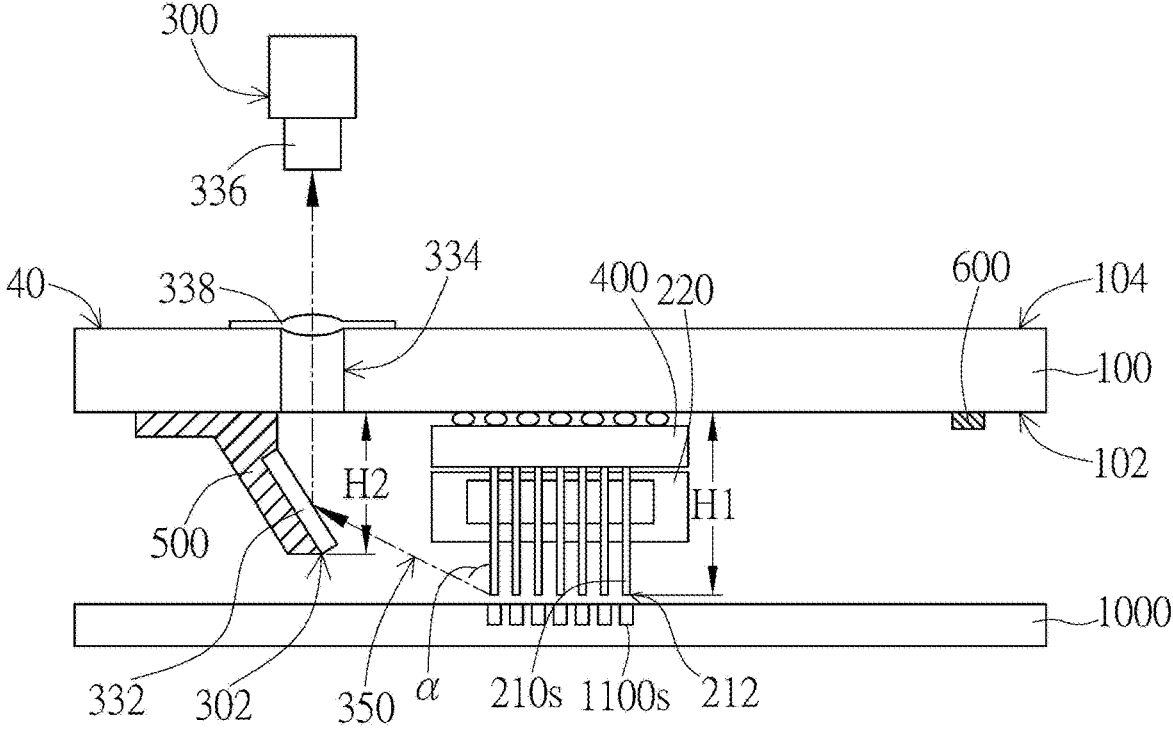
FIG. 6 is a schematic structural diagram of a probe card device according to another embodiment of the invention.

FIG. 6 is a schematic structural diagram of a probe card device according to another embodiment of the invention. Please refer to FIG. 6. In the embodiment which is similar to the aforementioned embodiments of FIG. 1 to FIG. 5, the same symbols can be used for reference, but it is not limited. A probe card device 40 at least includes a testing circuit board 100, a plurality of probe 210s and an image capture module 300. In addition, the probe card device 40 further includes a space transformer 400 and a guide member 220. The testing circuit board 100 is, for example, a print circuit board. The space transformer 400 is, for example, a space transforming carrier. The testing circuit board 100, the guide member 220 and the space transformer 400 can refer to the relative description of the embodiment of the FIG. 1 to FIG. 3, but they are not limited. The image capture module 300 can use, for example, a mirror 332, a through hole 334, a lens 336 and a micro lens 338. The plurality of the probe 210s are disposed on the first surface 102 of the testing circuit board 100, such as the center area of the first surface 102, but it is not limited. The plurality of probes 210s have substantially the same height, so the probe head 312 of each of the probe 210s has substantially the same first height H1 from the first surface 102 of the testing circuit board 100. The plurality of probes 210s can simultaneously contact to the plurality of contact pads 1100s of the object under test 1000 and perform the conduct electrical test.

Please refer to FIG. 6. In the embodiment, besides the mirror 332, the through hole 334 and the lens 336, the image capture module 300 further includes a micro lens 338 to calibrate the left-right reverse image reflected by the micro lens 332. The micro lens 338 is disposed between the mirror 332 and the lens 336, such as disposed on the second surface 104 of the testing circuit board 100 and aligned to the through hole 334. The micro lens 338 can be used to appropriately adjust the object distance and the image distance, the left-right reverse image reflected by the micro lens 332 can be calibrated to a correct image, and the image is provided to the equipment or the user to make judgement.

Please refer to FIG. 6. The probe card device 40 further includes one or more light source structures 600 such as light emitting diodes. The light source structure 600 irradiates a visible light to the probe head 212 to improve the image capturing effect. When the first height H1 of the probe head 212 from the first surface 102 is reduced such as smaller than 5 mm and the ambient visible light from the side surface of the probe card device 40 may be insufficient, the light source structure 600 can be disposed on the probe card device 40 to increase the brightness of the reflected light of the probe head 212. For example, the light source structure 600 can be disposed on the first surface 102 of the testing circuit board 100 and electrically connected to the testing circuit board

100. The testing circuit board 100 can be used to control the light source structure 600 to emit the visible light to directly or indirectly irradiate to the probe head 212. In addition, the light source structure 600 can be also disposed on the second surface 104 of the testing circuit board 100. The through hole of the testing circuit board 100 is used to guide the visible light to the first surface 102 of the testing circuit board 100 (not shown). The position of the one or more light source structure 600 can be arranged according to the distribution of the visible light, so the visible light image of the probe head 212 captured by the image capture module 300 has better image effect. The image capture module 300 of the invention is not limited to one or one set, and it can be added to multiple or multiple set of the image capturing structures 300 according to product design requirement. At the same time, the image capturing structures 300 capture the visible light image of the probe head 212 from different angles, so as to improve the contact image judgment effect when the probe head 212 contacts the contact pad 1100 of the object under test 1000.

As described above, about the probe card device, the image capture module is disposed on the probe card device to capture the visible light image of the probe head from the side surface of the probe, so as to check the contact situation of the probe head and the contact pad at any time. The first height of the head of the image capture module from the surface of the testing circuit board is smaller than the second height of the probe head from the surface of the testing circuit board, so it can prevent that the image capture module from contacting the object under test during the probe card testing. The image capture module captures the visible light image of the probe head from the side surface, it can more clearly determine the contact situation between the probe head and the contact pad, avoid blind corner in the captured image, and reduce the occurrence of misjudgment.

The above descriptions are only some preferred embodiments of the present invention. It should be noted that various changes and modifications can be made to the present invention without departing from the spirit and principles of the present invention. A person of ordinary skill in the art should clearly understand that the present invention is defined by the appended claims, and all possible changes such as substitutions, combinations, modifications, and diversions are within the scope of the present invention defined by the appended claims in line with the purpose of this invention.

What is claimed is:

1. A probe card device, comprising:
   a testing circuit board including a first surface and a second surface opposite to the first surface;
   at least one probe being disposed on the first surface of the testing circuit board and electrically connected to the testing circuit board, the probe including a probe head, wherein the probe head has a first height from the first surface; and
   an image capture module being disposed on the first surface of the testing circuit board, the image capture module including a head portion, the head portion having a second height from the first surface, wherein the second height is less than the first height, and the image capture module is aligned to the probe head to capture a visible light image of the probe head,
   wherein the image capture module includes a lens aligned to the probe head, and a diameter of the lens is smaller than the first height.

2. The probe card device of claim 1, wherein the testing circuit board includes a print circuit board.

3. The probe card device of claim 1, further comprising a guiding member, wherein the at least one probe is disposed in the guiding member.

4. The probe card device of claim 1, further comprising a space converter disposed between the probe and the testing circuit board, wherein the at least probe electrically connects to the testing circuit board through the space converter.

5. The probe card device of claim 1, further comprising a positioning module fixing the image capture module to the first surface of the testing circuit board to align the image capture module to the probe head.

6. The probe card device of claim 1, further comprising a light source for irradiating a visible light to the probe head.

7. A probe card device, comprising:

a testing circuit board including a first surface and a second surface opposite to the first surface;

at least one probe being disposed on the first surface of the testing circuit board and electrically connected to the testing circuit board, the probe including a probe head, wherein the probe head has a first height from the first surface; and an image capture module being disposed on the first surface of the testing circuit board, the image capture module including a head portion, the head portion having a second height from the first surface, wherein the second height is less than the first height, and the image capture module is aligned to the probe head to capture a visible light image of the probe head, wherein the image capture module includes an optical fiber and a lens, one end of the optical fiber is aligned to the probe head, and the other end of the optical fiber is connected to the lens, wherein a diameter of the optical fiber is smaller than the first height.

8. The probe card device of claim 7, wherein the testing circuit board includes a print circuit board.

9. The probe card device of claim 7, further comprising a guiding member, wherein the at least one probe is disposed in the guiding member.

10. The probe card device of claim 7, further comprising a space converter disposed between the probe and the testing circuit board, wherein the at least probe electrically connects to the testing circuit board through the space converter.

11. The probe card device of claim 7, further comprising a positioning module fixing the image capture module to the first surface of the testing circuit board to align the image capture module to the probe head.

12. The probe card device of claim 7, further comprising a light source for irradiating a visible light to the probe head.

\* \* \* \* \*